United States Patent [19]

Shaw et al.

[11] Patent Number: 4,999,496

[45] Date of Patent: Mar. 12, 1991

[54] MAGNIFICATION COMPENSATION APPARATUS

[75] Inventors: David A. Shaw, Kanata; Glen A. Herriot, Nepean, both of Canada

[73] Assignee: Nanoquest (Canada) Inc., Ottawa, Canada

[21] Appl. No.: 449,806

[22] Filed: Dec. 13, 1989

[30] Foreign Application Priority Data

Jun. 1, 1989 [CA] Canada .................................. 601466

[51] Int. Cl.$^5$ .......................................... H01J 37/256
[52] U.S. Cl. ..................................... 250/310; 250/306; 250/307; 250/396 R
[58] Field of Search ................... 250/310, 311, 396 R, 250/306, 307, 305

[56] References Cited

U.S. PATENT DOCUMENTS

| | | | |
|---|---|---|---|
| 3,576,438 | 4/1971 | Reese .................... | 250/310 |
| 3,715,582 | 2/1973 | Akahori et al. .......... | 250/310 |
| 4,006,357 | 2/1977 | Kanda et al. ........... | 250/310 |
| 4,071,759 | 1/1978 | Namae .................. | 250/310 |
| 4,180,738 | 12/1979 | Smith et al. ........... | 250/311 |
| 4,309,589 | 1/1982 | Hashimoto .............. | 250/310 |
| 4,321,510 | 3/1982 | Takigawa ............... | 250/397 |
| 4,424,448 | 1/1984 | Takigawa et al. ........ | 250/392 |
| 4,500,790 | 2/1985 | Bretscher et al. ....... | 250/397 |
| 4,547,669 | 10/1985 | Nakagawa et al. ........ | 250/310 |
| 4,568,861 | 2/1986 | Doran et al. ........... | 250/397 |
| 4,788,425 | 11/1988 | Kobayashi .............. | 250/311 |
| 4,818,873 | 4/1989 | Herriot ................ | 250/310 |
| 4,871,912 | 10/1989 | Kakubo et al. .......... | 250/310 |
| 4,894,541 | 1/1990 | Ono .................... | 250/310 |

Primary Examiner—Jack I. Berman
Assistant Examiner—Kiet T. Nguyen
Attorney, Agent, or Firm—John A. Baker

[57] ABSTRACT

The present invention relates to an apparatus for generating a magnification compensation signal for use in a scanning electron microscope. The apparatus includes an electron beam generator that generates a beam at a predetermined energy level in accordance with a beam energy signal. The apparatus allows for refocussing by varying the beam energy signal about a nominal value corresponding to the predetermined energy level. The apparatus also provides a magnification compensator producing a magnification compensation signal that varies in accordance with the variation of the beam energy signal from the predetermined energy level.

7 Claims, 3 Drawing Sheets

MAGNIFICATION COMPENSATION APPARATUS

FIELD OF INVENTION

The present invention relates to an apparatus for use in a scanning electron microscope. The apparatus provides a system which can compensate for magnification changes upon refocussing on a specimen. This compensation is useful when the specimen to be viewed has a varying surface height. The invention is especially applicable to those scanning electron microscopes used to analyze and measure dimensions on semiconductor wafers, although its utility is by no means limited to this type of application.

PRIOR ART

In order to determine the working distance of a scanning electron microscope (SEM), and thereby provide information required in focussing and magnification calibration of the SEM, it is necessary to estimate the microscope's present objective lens field strength by measuring the current in the lens coils. The objective lens magnetic field strength and the electron beam energy combine to determine at what distance a specimen will be brought into focus. Once the specimen is brought into focus it becomes necessary to accurately measure the working distance in order to determine the present magnification. This gauging of working distance is generally achieved by measuring the current in the objective lens coils and calculating the field strength produced therefrom. The calculation of magnification then typically produces results within ten percent of the actual magnification value.

These inaccuracies, however, are unacceptable when dealing with measurements requiring high precision. Such precision is required in the production of integrated circuit semiconductor wafers, since manufacturers must measure critical dimensions to within one percent of the actual values. A further demand is created by the fact that wafers are often warped and have minor surface undulations, and when viewing different areas thereon it is necessary to refocus and yet preserve the magnification calibration of the SEM expeditiously and with an equal degree of accuracy.

In order to produce readings within one percent accuracy, the problem of magnetic hysteresis existing within the cores of the objective lens of the SEM must be overcome. That is, the instantaneous magnetic field strength of the lens is based not only on its present current, but on all past currents that have existed in the coil. Intensifying this problem is the fact that many SEMs have lenses that are beam voltage compensated. That is, as nominal beam voltage is changed by the user, the lens currents automatically adjust in an attempt to maintain focus. In order to achieve an optimum beam voltage setting, the nominal voltage setting may be changed often as new specimens are observed. This results in the lens current constantly changing in order to compensate and maintain focus. As a result the current history of the lens becomes even more complex, thereby widening its hysteresis loop and reducing magnification accuracy. The present invention eliminates the need to change the lens currents after magnification calibration thereby avoiding the hysteresis problem.

The most direct prior art approach in dealing with magnetic lens hysteresis is to "de-gauss" the lens material, which effectively eliminates its current history. This procedure is required upon each necessary current change in order to refocus the SEM. Once the lens has been de-gaussed, the new lens current is approached monotonically from zero, without surpassing it. The procedure of de-gaussing a material involves applying an exponentially decaying sinusoidal current to, in this case, the lens coils. To achieve the new desired current, it is then necessary to apply a small but pure direct current to the coil, and linearly increase its amplitude until it reaches the desired lens current. The current must not overshoot the desired value, otherwise hysteresis will be introduced.

The necessary precision of these operations requires a sophisticated and expensive lens power supply capable of producing bi-polar currents allowing for exponential decay and also capable of producing a stable noise free direct current.

Another concern is that the coil and core materials likely react in a non-ideal way to the linearly increasing direct current. As a result, it becomes necessary to electrically and magnetically characterize the properties of the coil and core materials and adjust the signals applied thereto accordingly, further increasing the expense of this method.

In addition to the expense, the time required to de-gauss the lens upon every change in the working distance makes it impossible to have a focus compensating control system of sufficient speed. Worse yet, during a single focus operation it may be necessary to iteratively approach the ideal lens current, resulting in the need to de-gauss the lens several times to refocus only once.

A second prior art approach in dealing with objective lens hysteresis involves a computer software compensation system. A mathematical model results, which reveals the current history of the lens. The SEM can use such a model in one of two different ways. In one method the SEM can adjust magnification by estimating errors in the working distance using the lens history. In a second method, the mathematical model is used to produce a compensated current signal which when applied to the lens coil having a known hysteresis, produces the desired magnetic field, thereby correcting for the magnetic hysteresis.

The problem with mathematical models of current history in general is that, to achieve the required accuracy, the amount of information required in the model cannot be accumulated and applied economically. Coil and core characteristics of the lens must also be considered, further increasing the expense.

The second method incorporating a mathematical model, that is the method whereby the mathematical model is used to produce a compensated current, creates another concern. An expensive bi-polar supply is still required as the currents required by the model may be of either polarity.

A third prior art method of dealing with the magnetic hysteresis of the objective lens is to avoid it altogether by keeping the lens current constant. The SEM is then focussed mechanically using vertical stage motion. Once magnification is calibrated, the working distance is maintained at a fixed value by the vertical mechanical stage motion.

Mechanical focus methods are slow due to both the time for movement and the time for microscopic vibrations to die out after focussing. In addition, at higher magnifications, it is difficult to keep stage motion parallel to the electron beam causing a shifting view for the operator, and increasing the difficulty for an auto-focus system.

SUMMARY OF INVENTION

The present invention relates to a scanning electron microscope which consists of an apparatus for providing accurate magnification determination despite refocussing. The problems caused by hysteresis are overcome by maintaining constant lens currents once the SEM has been initially focussed and calibrated. Focus can then be adjusted as working distance changes when different areas of a warped specimen are viewed, by using variation in electron beam energy. This is achieved by changing the beam voltage of the microscope. This change in voltage compensates for changes in working distance and, as a result, there is no need for mechanical working distance adjustments, as in one facet of the prior art. In addition, complex mathematical models and lens de-gaussing techniques are not required since the lens currents remain constant during operation and hysteresis problems are avoided.

Focussing by varying the beam energy while maintaining constant lens currents provides changes in magnification which are predictable and easily compensated. Since magnification is a function of the distance scanned on the specimen, altering the scanning coil current of the SEM to offset the effects of a new beam energy can maintain magnification to a high degree of accuracy.

The present invention provides an apparatus for generating a magnification compensation signal for use in a scanning electron microscope including means for generating an electron beam at a predetermined energy level in accordance with a beam energy signal, and means for scanning the beam in accordance with a scanning signal. The apparatus comprises refocussing means for varying said beam energy signal about a nominal value corresponding to the predetermined energy level. The apparatus also comprises magnification compensation means connected to the refocussing means for producing a magnification compensation signal that varies in accordance with the variation of the beam energy signal from said predetermined value.

DETAILED DESCRIPTION OF THE PREFERRED EMBODIMENTS

Figure 1:
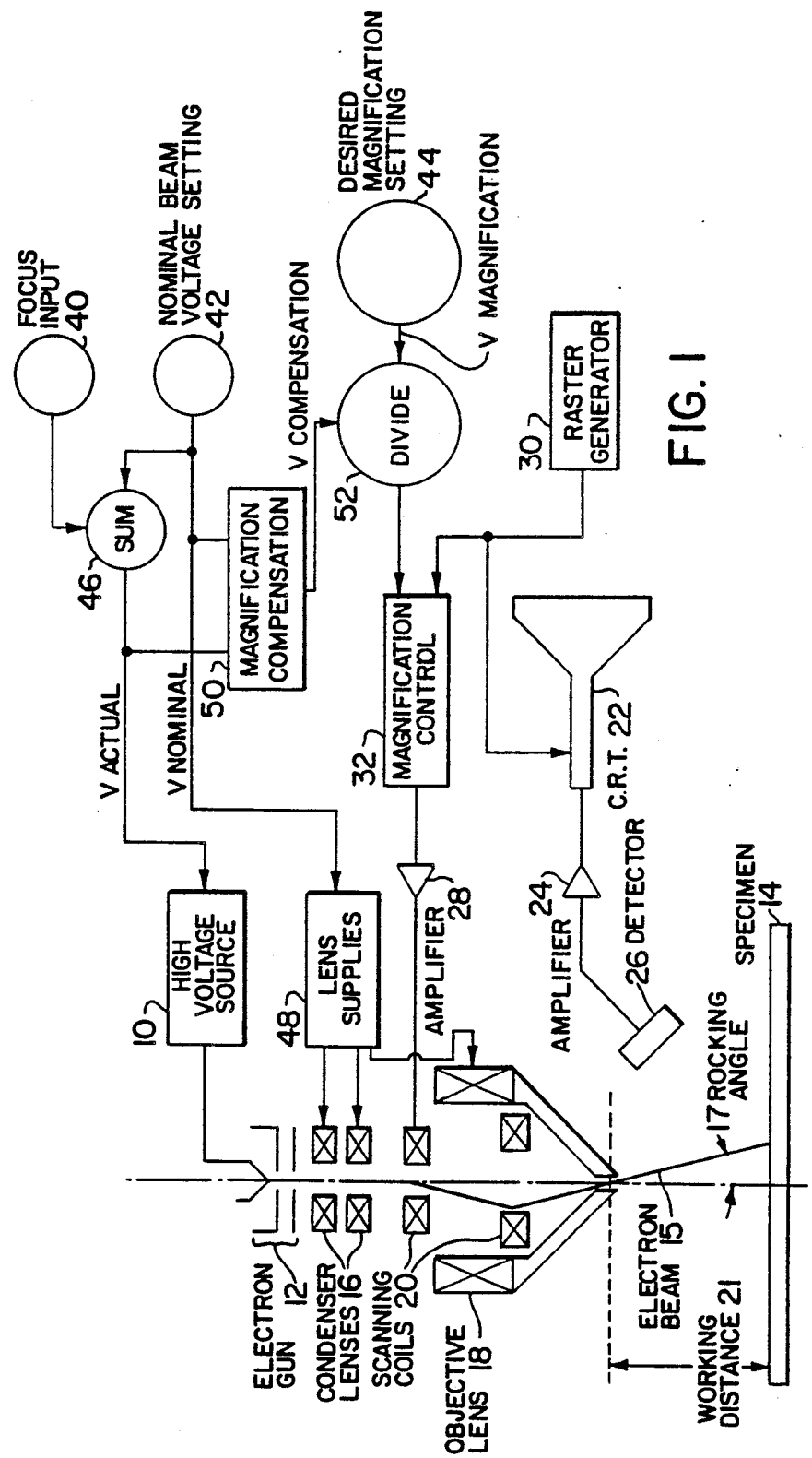
FIG. 1 is a block diagram of a scanning electron microscope according to one embodiment of the invention, having circuitry which holds magnification constant upon refocussing.

FIG. 1 is a block diagram of an embodiment of the present invention consisting of a scanning electron microscope (SEM) using fixed lens currents, having variable beam voltage and providing control circuitry to maintain focus and magnification calibration. In this embodiment an electron beam 15 is produced by a variable high voltage source 10 which supplies an electron gun 12. The electron beam initially passes through condenser lenses 16 which demagnify the beam. Next the beam passes through scanning coils 20 which provide an electromagnetic field which deflects the beam, allowing it to move across and thereby scan a specimen 14. An objective lens 18 focuses the beam and, with the aid of the condenser lenses 16, concentrate the beam onto the target specimen.

The scanning coils cause the electron beam to scan across the specimen. The maximum angle from the vertical that the electron beam has during scanning is known as the rocking angle 17. The rocking angle, in combination with the distance from the beam rocking point, that is a working distance 21, dictates the distance scanned on the specimen and hence the magnification of the microscope. The actual magnification is taken from the ratio of the distance scanned on the specimen to the distance scanned on a display, preferably a CRT (cathode ray tube) 22, on which the specimen's image can be viewed. The actual image of the specimen is supplied to CRT 22 using standard SEM techniques. Detector 26 detects the signal from the specimen, which is then amplified by amplifier 24 and fed into the brightness input of CRT 22.

A periodic ramp function drives the spot position of the CRT 22. Here the ramp function is provided by a raster generator 30. In addition, the raster generator feeds into a magnification controller 32, and in combination with an input $V_{magnification}$ from a desired magnification setting control 44, the magnification controller produces an output which is amplified by an amplifier 28 and supplies the scanning coils 20. Since these scanning coils, in combination with the electron beam energy, dictate the rocking angle and thereby the distance scanned on the specimen, the inputs to the magnification controller which feeds the scanning coils 20 dictate the magnification of the microscope. Further details of how the magnification setting, the raster generator and the magnification controller control the rocking angle can be seen in Canadian Patent Application No. 550,955, which was filed Nov. 3, 1987.

Prior to discussing the compensating circuitry and operation of the apparatus it is first necessary to note the preliminary setup of the SEM. A nominal beam voltage, $V_{nominal}$, is selected and set by either a manual control knob or a computer input 42. A focus input 40, again either manual or computer controlled, is set to zero. At this point $V_{nominal}$ is the input to the high voltage source 10 and a nominal beam energy is produced. $V_{nominal}$ simultaneously provides an input to the lens supplies 48. Preliminary focussing is then achieved by varying the current in the objective lens 18, or the height of the specimen 14. The magnification calibration of the SEM is accomplished in a known manner as is described, for example, in Canadian Patent Application No. 550,955.

In operation, focus input 40 and nominal beam voltage input 42 are supplied as inputs to a summing unit 46. The summing unit adds the two inputs and produces an output $V_{actual}$ which is then input to the high voltage source 10 in order to control the energy of the electron beam. The signal $V_{nominal}$ does not change after the preliminary setup described above. As a result the lens supplies 48 provide constant current to condenser lenses 16 and objective lens 18. Since the current supplied to these lenses does not vary, hysteresis is not a concern.

$V_{actual}$ and $V_{nominal}$ are also fed into a magnification compensation unit 50 as inputs. This module consists of a computational circuit which executes the following transfer function:

$$V_{compensation} = [OD - c \cdot V_{actual}]/[OD - c \cdot V_{nominal}] \cdot [V_{nominal}/V_{actual}]^{0.5}$$

where:
OD is the object distance from the objective lens up to the beam crossover below the lower condenser lens.
A typical value for OD can be 200 mm.
c is a proportionality constant between the Beam Voltage and the Focal length of the objective lens.
A typical value for c can be 0.01 mm/volt.

The first term represents the ratio of image distances of the objective lens. The square root term is the ratio of rocking angles.

The image distance grows when the beam voltage increases above the nominal beam voltage. This tends to increase the length of the scan lines and hence decrease the magnification.

The rocking angle decreases with the square root of the beam voltage which diminishes the length of the scan lines and thus increases the magnification.

Figure 3:
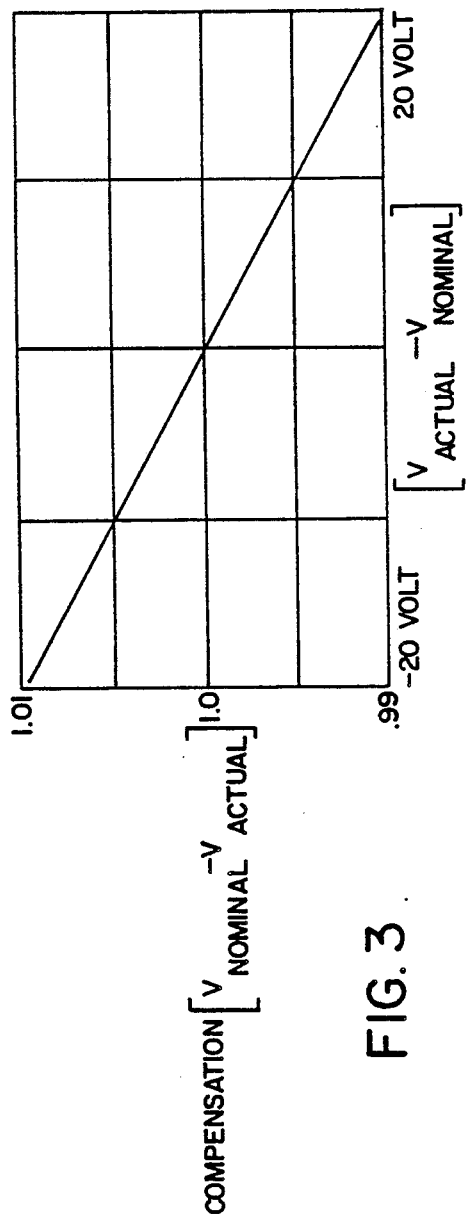
FIG. 3 is a diagram showing the output of the magnification compensation unit as the beam voltage varies about nominal.
Figure 4:
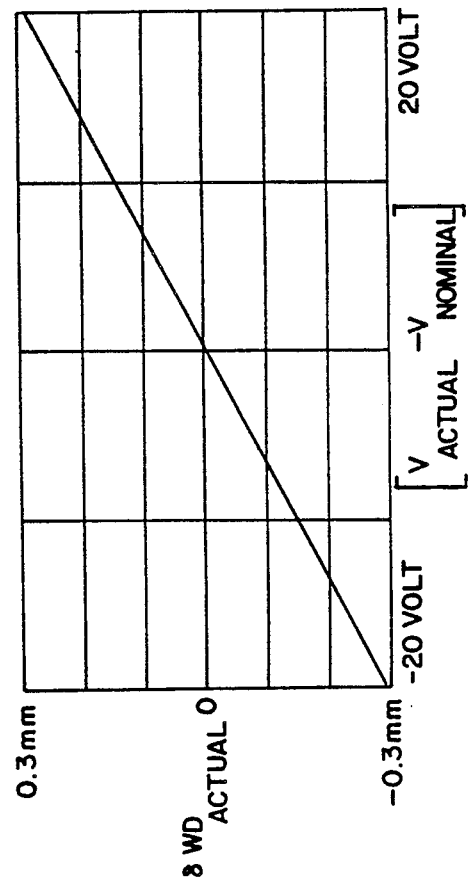
FIG. 4 is a diagram showing the corresponding variation in working distance.

This transfer function produces a value of 1 when its inputs are equal, which is typically the case when the focus input 40 equals zero. However, if a change in the working distance occurs, due to lateral movement of a warped specimen, the focus input 40 will have to be altered, either manually or by computer input, to refocus at the new working distance. FIG. 4 is a diagram which shows the change in working distance for a change in $V_{actual}$ about $V_{nominal}$. Once refocussing has been achieved it becomes necessary to correct the magnification, and the magnification compensation unit 50 accomplishes this. Now that the focus input is non-zero, $V_{actual}$ and $V_{nominal}$ will not be equal. As a result, the magnification compensation unit produces a value slightly different from 1. The greater the difference between the inputs, the greater the output's discrepancy from 1, in accordance with the above transfer function which is illustrated in FIG. 3 which is a diagram showing the output of the magnification compensation unit as the beam voltage varies about nominal.

This output value, $V_{compensation}$, is then input into the denominator of divider 52 along with the desired magnification setting input 44. When the working distance is unchanged, and $V_{nominal}$ equals $V_{actual}$, $V_{compensation}$ will equal 1 and therefore will have no effect on the output of divider 52. However, when the working distance is changed, e.g. while moving a warped specimen laterally, a $V_{compensation}$ value slightly different from 1 is divided into the desired magnification setting 44 to produce a new input for the magnification controller 32, which, in turn, alters the current in the scanning coils 20.

The input to the high voltage source 10, $V_{actual}$, is now changed from its previous value which was equal to $V_{nominal}$. This change comes about as a result of refocussing and the subsequent change in the focus input 40. Thus the high voltage source now produces an electron beam having a different energy level than before which is compensated for by the aforementioned changes in the scanning coil currents.

Generally, if the current in the scanning coils is constant, increasing the beam energy decreases the rocking angle and the scanning width is decreased. Conversely, decreases in beam energy increase the rocking angle and the scan width is increased. Changes in the current in the scanning coils, i.e. changes in the output of the magnification controller 32, have an opposite effect. The greater the current in the scanning coils, the greater the beam deflection and hence the greater the scan width. The combination of these two effects serves to limit the change in magnification due to refocussing in this embodiment.

Figure 2:
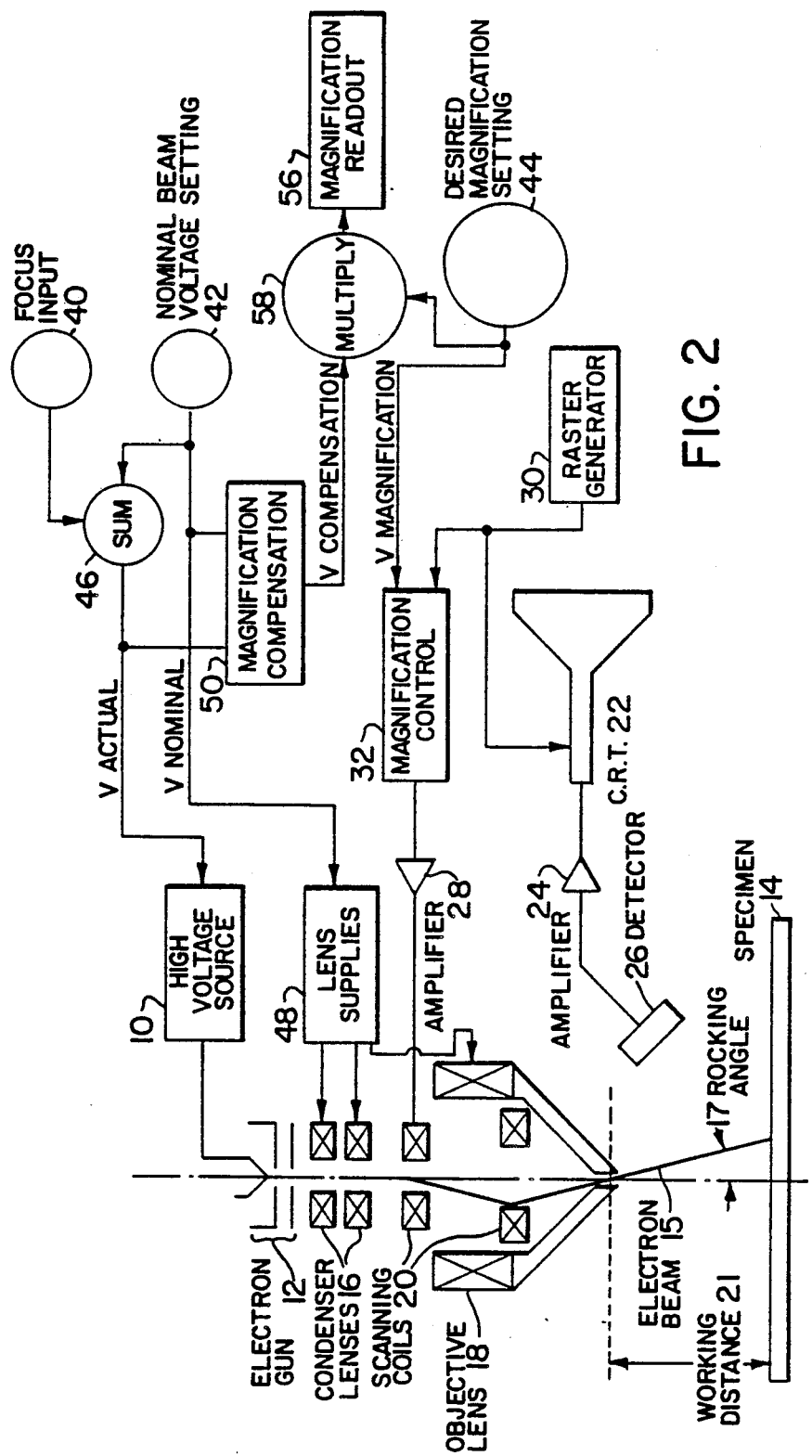
FIG. 2 is a block diagram of a scanning electron microscope according to another embodiment of the invention, having circuitry which displays the new magnification upon refocussing.

FIG. 2 depicts another embodiment of the present invention. Here, instead of directly feeding the output of the magnification compensation unit 50 through a divider and into the magnification controller in order to automatically compensate for any refocussing, the output of the multiplier 58 is simply routed to a magnification readout display 56. As a result the change in magnification is not compensated for, as in the first embodiment. The new magnification produced as a result of a change in working distance and subsequent refocussing is output at display 56 so that calculations may be made, on any measurements taken, to accommodate magnification changes. The desired magnification setting 44 now feeds directly into magnification controller 32 as there is no feedback to the controller in this embodiment.

For example, let the desired magnification of a semiconductor wafer specimen be 10,000. Upon encountering a surface undulation in the specimen, focus input 40 has to be adjusted and magnification will be altered. As a result $V_{actual}$ and $V_{nominal}$ are not equal and the magnification compensation unit 50 will produce a $V_{compensation}$ value slightly different from one. If $V_{compensation}$ equals 1.0003, for example, then the magnification readout display 56 fed from multiplier 58 would indicate 10,003 magnification. The operator could then record this for use in critical dimension measurements. Alternately, it could be output to a computer for automatic compensation of precision measurements.

For a typical semiconductor wafer sample, in the extreme case where height variations in the specimen are comparable to the entire thickness of a semiconductor wafer, the image size varies by about one percent. This variation may be easily calculated and used to compensate critical dimension calculations for such a specimen.

The embodiments of the invention in which an exclusive property or privilege is claimed are defined as follows:

1. An apparatus for generating a magnification compensation signal for use in a scanning electron microscope (SEM) including means for generating an electron beam at a predetermined energy level in accordance with a beam energy signal, and means for scanning said beam in accordance with a scanning signal, said apparatus comprising:
   refocussing means for varying said beam energy signal about a nominal value corresponding to said predetermined energy level, and
   magnification compensation means connected to said refocussing means for producing a magnification compensation signal that varies in accordance with the variation of the beam energy signal from said nominal value.

2. The apparatus according to claim 1, including connecting means for connecting said magnification compensation signal to said means for scanning to modify said scanning signal to adjust the magnification of the SEM to compensate for refocussing.

3. The apparatus according to claim 1, including display means using said magnification compensation signal to display the actual magnification of said SEM.

4. The apparatus according to claim 1, wherein said magnification compensation means includes a magnification compensation unit having first and second inputs and an output, said output providing a signal equal to 1 if said inputs are equal and providing a signal slightly different from 1 if said inputs are not equal, said value provided by said output deviating from 1 increasingly as the difference in said inputs increases.

5. The apparatus according to claim 4, wherein said magnification compensation unit has the transfer function:

$$V_{compensation} = [OD - c \cdot V_{actual}] / [OD - c \cdot V_{nominal}] \cdot [V_{nominal} / V_{actual}]^{0.5}$$

Where:

OD is the object distance from the objective lens up to the beam crossover below the lower condenser lens; and c is a proportionality constant between the beam voltage and the focal length of the objective lens.

6. The apparatus according to claim 2, wherein said magnification compensation means includes a divider having an input corresponding to said magnification compensation signal, a numerator input corresponding to a desired magnification setting and an output feeding into a magnification controller for producing said scanning signal.

7. The apparatus according to claim 3, wherein said magnification compensation means includes a multiplier, having an input corresponding to said magnification compensation signal, a second input corresponding to a desired magnification setting and an output feeding into a magnification readout display.

* * * * *